United States Patent [19]
Hoshi et al.

[11] Patent Number: 5,635,742
[45] Date of Patent: Jun. 3, 1997

[54] LATERAL DOUBLE-DIFFUSED MOSFET

[75] Inventors: Masakatsu Hoshi, Yokohama; Teruyoshi Mihara, Yokosuka, both of Japan

[73] Assignee: Nissan Motor Co., Ltd., Yokohama, Japan

[21] Appl. No.: 660,211

[22] Filed: Jun. 3, 1996

Related U.S. Application Data

[63] Continuation of Ser. No. 378,269, Jan. 26, 1995.

[30]  Foreign Application Priority Data

Feb. 2, 1994  [JP]  Japan ................................ 6-010984

[51] Int. Cl.⁶ .................................................. H01L 27/10
[52] U.S. Cl. .......................... 257/337; 257/341; 257/343; 257/401
[58] Field of Search ........................... 257/337, 341–343, 257/390, 401

[56]  References Cited

U.S. PATENT DOCUMENTS

| | | | |
|---|---|---|---|
| 4,873,503 | 10/1989 | Daleo et al. | 257/337 |
| 4,890,142 | 12/1989 | Tonnel et al. | 257/343 |
| 5,004,705 | 4/1991 | Blackstone | 257/506 |
| 5,192,989 | 3/1993 | Metsushita et al. | 257/343 |

*Primary Examiner*—Donald L. Monin, Jr.
*Attorney, Agent, or Firm*—Foley & Lardner

[57]  ABSTRACT

A lateral double-diffused MOSFET has a semiconductor substrate, a drain region formed on the substrate, a gate insulation film formed on the drain region, a gate electrode formed on the gate insulation film, source and drain openings formed through the gate electrode, a first conductive region formed under the drain region, a source electrode formed on the source openings, a drain electrode formed on the drain openings, and second conductive regions for connecting the drain electrode to the first conductive region. The source and drain openings are cyclically arranged so that at least two rows of source openings are arranged between adjacent drain openings, to reduce the ON resistance of the MOSFET.

16 Claims, 14 Drawing Sheets

LATERAL DOUBLE-DIFFUSED MOSFET

This application is a continuation of application Ser. No. 08/378,269, filed Jan. 26, 1995.

BACKGROUND OF THE INVENTION

1. Field of the Invention

The present invention relates to a lateral power MOSFET adopted for intelligent power ICs, smart power ICs, and vehicle ICs, and particularly, to a lateral power MOSFET having low ON resistance.

2. Description of the Prior Art

Power MOSFETs are widely used because they are easy to drive and have a high switching speed compared with bipolar transistors. Their ON resistance and operation speed, however, must be further improved. Lateral power MOSFETs have been briskly developed and marketed as elements of power ICs for driving the actuators of motors and coils for office and factory automation equipment, information equipment, vehicles, household electric equipment, etc. The power ICs are actively used because they are controllable with a compact controller, can be installed in a motor, and cooperate with intelligent detectors and protection circuits. To integrate PWM controllers and three-phase bridge circuits for controlling a motor, the lateral power MOSFETs are advantageous because they are capable of providing multiple outputs. To fabricate a plurality of output transistors in a chip, the lateral power MOSFETs are advantageous because their source electrodes, gate electrodes, and drain electrodes are on the same principal plane.

The most important factor of the power MOSFET is ON resistance $R_{ON}$. FIGS. 1A and 1B show a lateral power MOSFET of 50 V in breakdown voltage disclosed in Japanese Laid-Open Patent Publication No. 3-257969. This MOSFET has a p base region 5 and an $n^+$ source region 6 that are formed by double diffusion of impurities. This MOSFET is called a double-diffused MOSFET (DMOSFET), and a lateral DMOSFET is called an LDMOSFET.

FIG. 1A is a sectional view and FIG. 1B is a plan view showing the LDMOSFET. In FIG. 1A, an $n^+$ buried layer 2 is formed in a principle plane of a p substrate 1, a p epitaxial layer 3 is formed on the same principle plane, and n drain regions 4 are formed as n wells in the p epitaxial layer 3. LDMOSFETs are formed in the n wells, respectively, to operate independently of one another. In each of the n drain regions 4, p base regions 5 and $n^{30}$ drain regions 8 are formed. In each of the p base regions 5, an $n^+$ source region 6 is formed. A gate insulation film 9 is formed on the entire surface of the n drain regions 4, and a gate electrode 10 is formed on the gate insulation film 9, to partly cover the n drain region 4 between the adjacent p base regions 5 as well as the p base regions 5. A first insulation interlayer 11 is formed over the gate electrode 10, and a source electrode 12 and a first drain electrode 13 are formed on the first insulation interlayer 11. A second insulation interlayer 14 is formed over the source electrode 12, and a second drain electrode 15 is formed on the second insulation interlayer 14. In FIG. 1B, six source cell regions S are arranged in a hexagon pattern around a drain cell region D.

According to this prior art, the source electrode 12 and second drain electrode 15 form a double layer structure, to form source and drain openings as cells. The hexagonal pattern of source cell regions S is advantageous to integrate the elements and reduce the ON resistance $R_{ON}$ of the LDMOSFET to some extent.

The ratio of the source cell regions S to the drain cell regions D of the prior art is 2:1 as shown in FIG. 1B, to hardly reduce channel resistance. Namely, this prior art is incapable of sufficiently reducing the ON resistance. It is required, therefore, to provide a technique of further reducing the ON resistance.

SUMMARY OF THE INVENTION

An object of the present invention is to provide a novel LDMOSFET involving low ON resistance and a small conduction loss.

In order to accomplish the object, the present invention provides an LDMOSFET shown in FIGS. 2 to 3C. The LDMOSFET has a semiconductor substrate 1 of first conductivity type. A first conductive region 2 is formed on the substrate 1. A p epitaxial layer 3 is formed on the p substrate 1, and a plurality of n drain regions 4 are formed as n wells in the p epitaxial layer 3. LDMOSFETs, i.e., power MOSFETs are fabricated in the n wells, respectively, to operate independently of one another. It is possible to form an n drain region 4 over the p substrate 1 and fabricate discrete devices. The LDMOSFET has a gate insulation film 9 formed on the drain region 4, a gate electrode 10 formed on the gate insulation film 9, source and drain openings formed through the gate electrode 10, a base region 5 of first conductivity type formed under each of the source openings, a source region 6 of second conductivity type formed inside the base region 5, a source electrode 12 formed on and in contact with the source regions 6, a drain contact region 8 formed under each of the drain openings, a first drain electrode 13 formed on and in contact with the drain contact regions 8, an insulation interlayer 14 formed on the source electrode 12, and a second drain electrode 15 formed on the insulation interlayer 14 and electrically connected to the first drain electrode 13. The LDMOSFET of the present invention is characterized by:

(a) a second conductive region 7 of low resistance to electrically connect the drain contact region 8 to the first conductive region 2 as shown in FIG. 2; and (b) the source and drain openings cyclically arranged at predetermined pitches so that there are at least two rows of source openings between adjacent drain openings as shown in FIG. 3A.

In the following explanation, the first conductivity type is p and the second conductivity type is n. According to the present invention, the first conductivity type may be n, and the second conductivity type may be p. The source and drain opening formed through the gate electrode will be referred to as source cell regions S and drain cell regions D, respectively. FIG. 3B is an enlarged plan view showing the inside of one of the source cell regions S. The source opening formed through the gate electrode is square, and the $n^+$ source region 6 having an inner hole is formed inside the square source opening. FIG. 3C is an enlarged view showing the inside of the drain cell region D. The $n^-$ drain contact region 8 is formed in the drain cell region D.

The source and drain cell regions S and D are arranged in one of the patterns shown in FIGS. 3A, 5, and 12 to 14. As will be explained later in detail with reference to equivalent circuits of FIGS. 4, 6, and 9, the patterns of the source and drain cell regions S and D must follow rules to reduce the ON resistance of the LDMOSFET. Namely, the number of rows of source cell regions S arranged between adjacent drain cell regions D must be in the range of two to ten.

FIGS. 10 and 11 are sectional views showing LDMOSFETs having preferable structures to reduce the ON resistance thereof. These LDMOSFETs have a first conductive region 2 and a second conductive region 7 made of refractory metal silicide such as $WSi_2$, $MoSi_2$, $TiSi_2$, $CoSi_2$, or $PtSi_2$.

What is important for a power MOSFET is to reduce the ON resistance $R_{ON}$, i.e., $R_{ON}$·A per unit chip area thereof. As shown in FIGS. 3a, 5, and 12 to 14, the present invention is capable of densely arranging the source cell regions S and drain cell regions D in a close-packed structure, to increase a channel area that effects a MOSFET operation and reduces the ON resistance $R_{ON}$·A. In this case, the resistance of the first conductive region is an important factor. The present invention employs a first conductive metal region 16 as shown in FIG. 10, to greatly reduce the ON resistance $R_{ON}$·A.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1A:
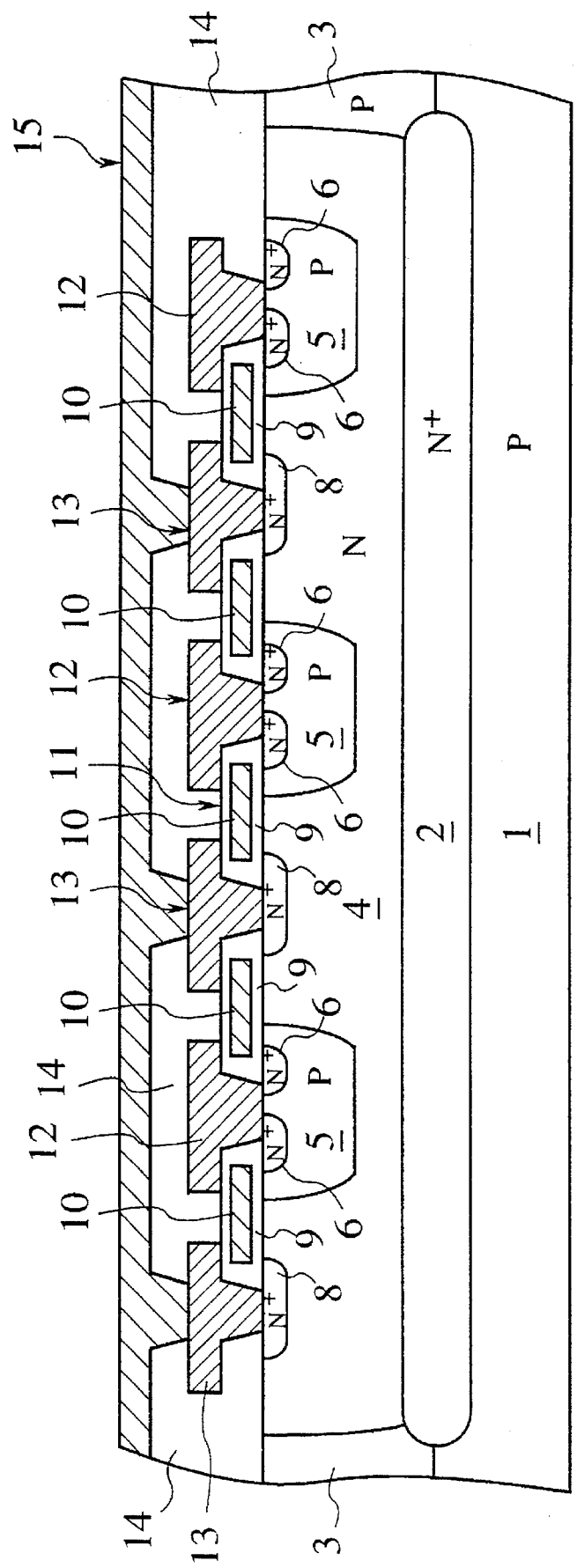
FIG. 1A is sectional view showing an LDMOSFET according to a prior art.
Figure 1B:
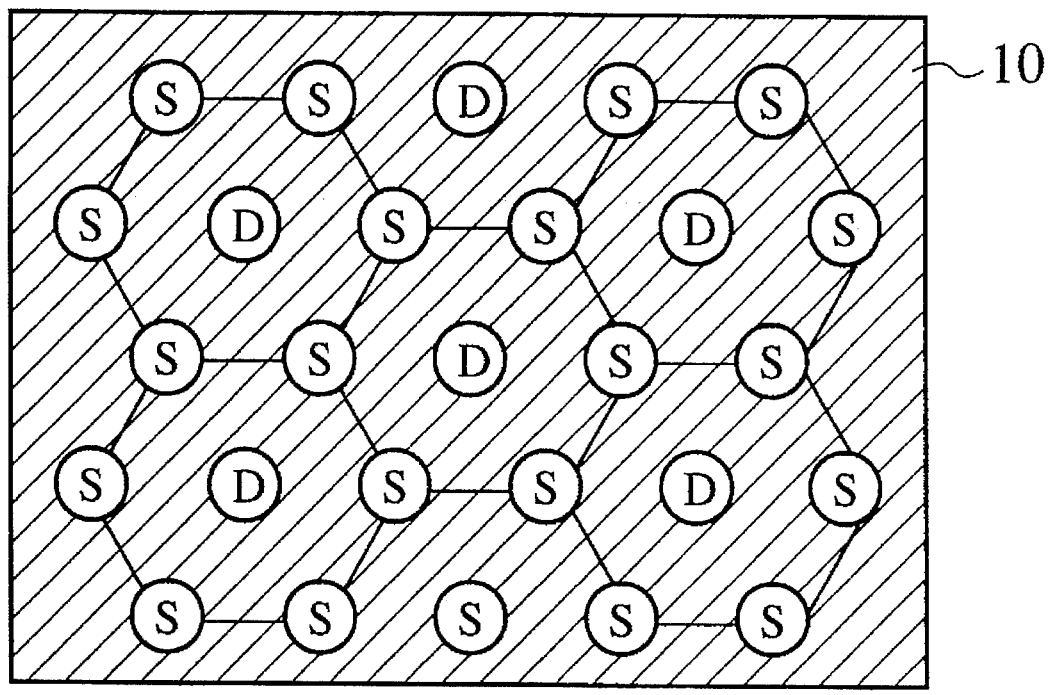
FIG. 1B is a plan view showing a gate electrode of the LDMOSFET of FIG. 1A.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
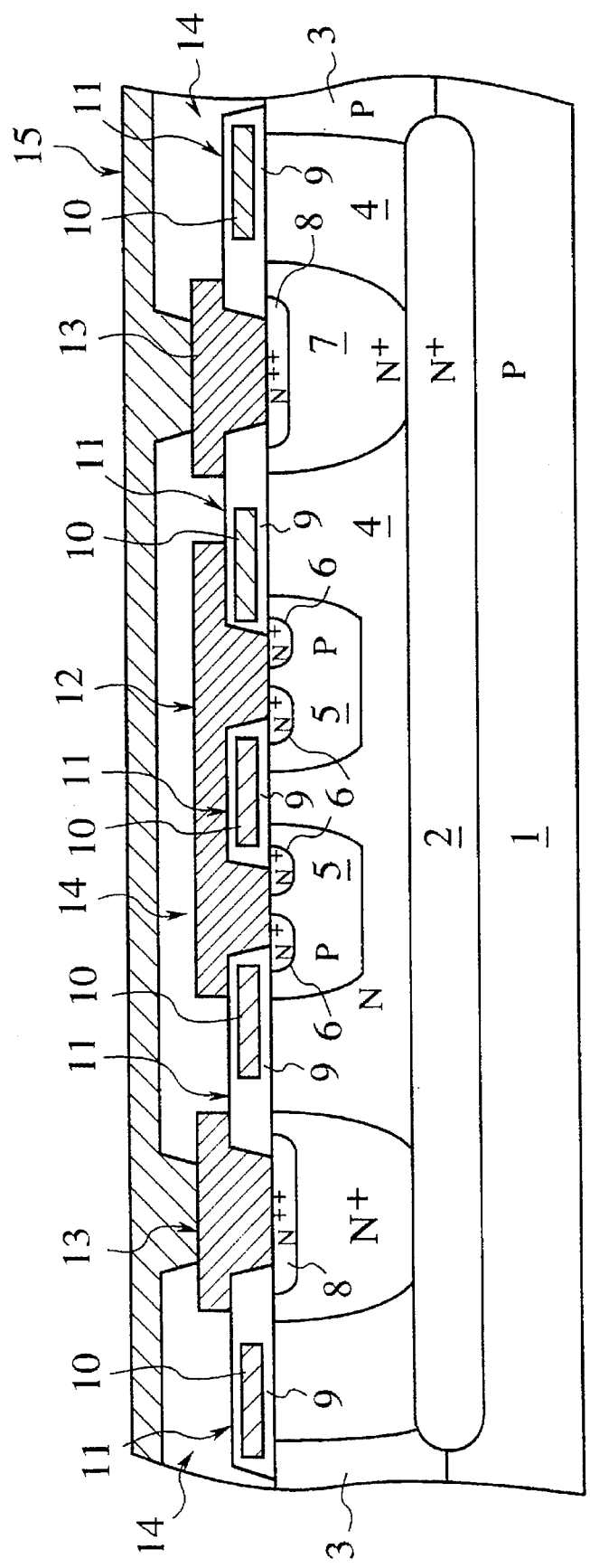
FIG. 2 is a sectional view showing an LDMOSFET according to a first embodiment of the present invention.
Figure 3A:
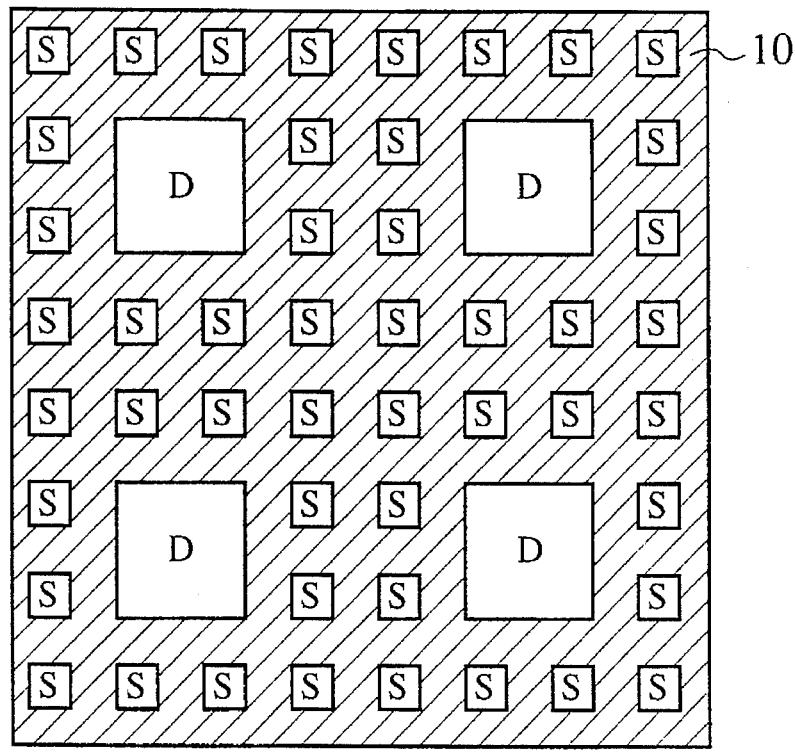
FIG. 3A is a plan view showing an arrangement of source and drain cell regions of the LDMOSFET of FIG. 2.
Figure 3B:
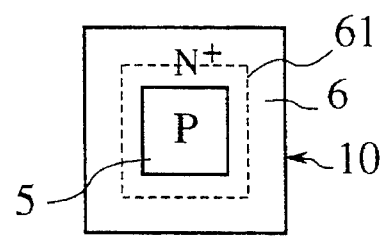
FIG. 3B is an enlarged view showing a source cell region S FIG. 3A.
Figure 3C:
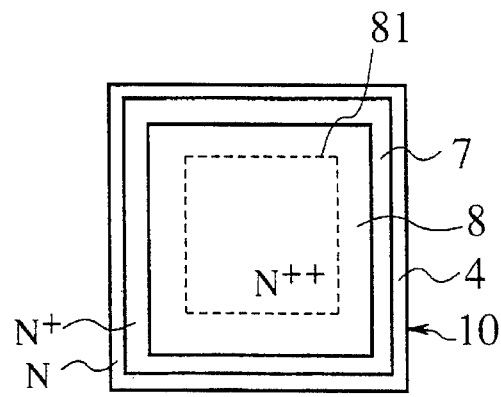
FIG. 3C is an enlarged view showing a drain cell region D of FIG. 3A.

FIGS. 2 to 3C show an LDMOSFET according to the first embodiment of the present invention, in which FIG. 2 is a sectional view showing the LDMOSFET serving as an element of a power IC and FIG. 3A is a plan view showing an arrangement of source and drain cell regions of the LDMOSFET. In FIG. 2, an $n^+$ buried layer 2 is formed in a principle plane of a p semiconductor substrate 1. The buried layer 2 is 5 to 50 μm thick and $5 \times 10^{17}$ to $10^{21}$ $cm^{-3}$ in impurity concentration. A p epitaxial layer 3 is formed in the principle plane of the p substrate 1. The p epitaxial layer 3 is 3 to 30 μm thick and $1 \times 10^{14}$ to $5 \times 10^{16}$ $cm^{-3}$ in impurity concentration. N drain regions 4 are formed from the surface of the p epitaxial layer 3 to a depth of 3 to 20 μm at an impurity concentration of $1 \times 10^{15}$ to $1 \times 10^{17}$ $cm^{-3}$ by diffusing phosphor, etc. The n drain regions 4 are n wells formed inside the p epitaxial layer 3. For example, six n wells are formed on the same semiconductor substrate, to fabricate six LDMOSFETs in the n wells, respectively, so that the LDMOSFETs may operate independently of one another. In each of the n drain regions 4, there are formed p base regions 5 each of 1 to 3 μm in diffusion depth and $1 \times 10^{16}$ to $1 \times 10^{18}$ $cm^{-3}$ in impurity concentration, as well as $n^+$ sinker regions 7 each of 3 to 20 μm in diffusion depth and $5 \times 10^{17}$ to $1 \times 10^{20}$ $cm^{-3}$ in impurity concentration. The $n^+$ sinker regions 7 reach the $n^+$ buried layer 2. Dopant of the p base regions 5 is, for example, boron, and that of the $n^+$ sinker regions 7 is, for example, phosphor. An $n^+$ source region 6 is formed in the p base region 5. The $n^+$ source region 6 is 0.1 to 1 μm in diffusion depth and $1 \times 10^{18}$ to $1 \times 10^{21}$ $cm^{-3}$ in impurity concentration. A doped polysilicon gate electrode 10 of 350 to 800 nm thick is formed on a gate insulation film 9 of 10 to 100 nm thick, to partly cover the drain region 4 between the adjacent p base regions 5 as well as the p base regions 5. An $n^+$ drain contact region 8 of 0.1 to 1 μm in diffusion depth and $5 \times 10^{18}$ to $2 \times 10^{21}$ $cm^{-3}$ in impurity concentration is formed in each of the $n^-$ sinker regions 7. The $n^+$ source regions 6 and $n^+$ drain contact regions 8 may be formed by implanting ions of, for example $^{75}As^+$. As shown in FIG. 3B, the $n^+$ source region 6 is a square formed inside a square window of the gate electrode 10 and has a center square hole. The $n^+$ source region 6 may be a ring or a polygon having a hole. A first insulation interlayer 11 made of, for example, an $SiO_2$ film formed by CVD is formed on the gate electrode 10, and a source electrode 12 and a first drain electrode 13 are formed on the first insulation interlayer 11. A second insulation interlayer 14 is formed on the source electrode 12, and a second drain electrode 15 is formed on the second insulation interlayer 14. The second insulation interlayer 14 may be a composite film of plasma-tetraethylorthosilicate $SiO_2$ (p-TEOS) and spin-on glass (SOG). More precisely, an SOG film of 0.2 μm thick is deposited on a p-TEOS film of 0.5 μm thick, and a p-TEOS film of 0.7 μm thick is formed on the SOG film. The source electrode 12 may be formed of a Ti—Al composite film or an Al—Si film of about 1.5 μm thick. The second drain electrode 15 may be an Al—Si film of 2.0 μm thick. The source electrode 12 and second drain electrode 15 form a two-layer wiring structure having overlaid parts. The SOG film is useful to flatten the second insulation interlayer 14 to let the wiring of the second drain electrode 15 easier.

FIG. 3A is a plan view showing an arrangement of the source and drain cell regions, FIG. 3B is an enlarged view showing the source cell region, and FIG. 3C is an enlarged view showing the drain cell region. The source cell region corresponds to an opening formed through the gate electrode 10 made of, for example, a doped polysilicon (DOPOS) film, and serves as a source region. The drain cell region corresponds to an opening formed through the gate electrode 10 and serves as a drain region. Although each cell region shown is a square, it may be a polygon, a circle, or other. In practice, the opening of each cell region is formed on the first insulation interlayer 11 that insulates the source and drain electrodes 12 and 13 from the gate electrode 10, so that the contact hole in the cell region is slightly smaller than the opening formed through the gate electrode 10. A source contact hole 61 in the source cell region connects the source electrode 12 to the n$^+$ source region 6, and a drain contact hole 81 in the drain cell region connects the first drain electrode 13 to the n$^+$ drain contact region 8.

In FIG. 3A, the first embodiment arranges four rows of source cell regions S at regular intervals into a square pattern. Central four of the source cell regions S and spaces among them are replaced with one drain cell region D. Consequently, the drain cell region D is surrounded by a row of source cell regions S, and there are two rows of source cell regions S between adjacent drain cell regions D. This is a basic pattern of source and drain cell regions S and D, and the basic pattern is cyclically arranged. In FIG. 3A, the width of the source cell region S is equal to a distance between adjacent source cell regions S. This configuration does not limit the present invention. For example, each side of the source cell region S may be 6 μm long, and a distance between adjacent source cell regions S may be 5 μm. The distance between adjacent source cell regions S must follow rules to be mentioned later.

The operation of the LDMOSFET according to the first embodiment of the present invention will be explained. When a positive voltage is applied between the second drain electrode 15 and the source electrode 12 and when a positive voltage exceeding a threshold is applied to the gate electrode 10, the conductivity type of the surface of each p base region 5 just under the gate electrode 10 changes to n, to form a channel. In connection with the source cell region S facing the drain cell region D, a current flows from the n$^+$ drain contact region 8 into the surface layer of the n drain region 4, passes through the channel, and reaches the n$^+$ source region 6. In connection with the source cell region S that is distal from the drain cell region D, a current vertically flows from the n$^+$ drain contact region 8 to the n$^+$ sinker region 7, horizontally flows through the n$^+$ buried layer 2, vertically flows through the n drain region 4, passes through the channel, and reaches the n$^+$ source region 6. As a result, the LDMOSFET is turned ON. When a negative voltage is applied to the gate electrode 10, the n channel formed on the surface of each p base region 5 disappears to turn OFF the LDMOSFET.

In this way, the LDMOSFET according to the first embodiment of the present invention arranges two rows of source cell regions S between adjacent drain cell regions D, to pass currents through two paths one via a surface layer of the n drain region 4 and the other via the n$^+$ buried layer 2, depending on the positions of the source cell regions S relative to the drain cell region D. Namely, the first embodiment increases the number of parallel current paths between a drain and a source, to thereby reduce the ON resistance $R_{ON}$ of the LDMOSFET. A given LDMOSFET is formed in a corresponding n well, so that it operates independently of other LDMOSFETs, to realize multiple outputs. The details of the ON resistance $R_{ON}$ will be explained later with reference to FIGS. 4 and 7.

The first embodiment arranges two rows of source cell regions S between adjacent drain cell regions D. The number of rows of source cell regions S may be increased if required. Namely, the number of rows of source cell regions arranged between adjacent drain cell regions must be at least two, to let currents flow through a plurality of parallel paths depending on the positions of the source cell regions relative to the drain cell regions. If there is only one row of source cell regions between adjacent drain cell regions, each source cell region faces one of the drain cell regions, to provide no such effect.

In FIGS. 3A to 3C, each of the source and drain cell regions S and D has a square shape. In this case, the impurity concentration by diffusion at a corner of each cell is thinner than that at an edge of the cell, to unevenly pass a current when an applied gate voltage is low. In this case, the corners of each cell may be cut or curved. Namely, the shape of each cell may be polygonal, circular, or one having curved corners, to realize a uniform impurity concentration profile and improve a current distribution.

The first embodiment of the present invention connects the n$^+$ buried layer 2 to the drain electrode 13 through the n$^+$ sinker region 7 having low electric resistance. The sinker region 7 is usually formed by deep diffusion from the surface of the n drain region 4 up to the n$^+$ buried layer 2. At this time, the high-concentration n$^+$ sinker region 7 horizontally diffuses, and therefore, the area of the drain opening, i.e., the drain cell region D must be large. In consideration of this horizontal diffusion, the first embodiment sets the area of the drain cell region D to be equal to the sum of four (2×2) source cell regions S and spaces among them. When the width of each source cell region S is equal to a distance between adjacent source cell regions S, the drain cell region D corresponds to nine source cell regions S. In this way, each drain opening of the first embodiment is large.

A parasitic JFET is formed between adjacent p base regions 5, which serve as the gate regions of the parasitic JFET. If the adjacent source cell regions are too close to each other, the resistance of the parasitic JFET increases. Accordingly, a distance between adjacent source cell regions S must not be too short, and the p base regions 5 must not be pinched off due to an expanding depletion layer. In the example of FIG. 3A, the distance between adjacent source cell regions S must be at least half of the width of the source cell region S. It is possible to narrow the distance between the source cell region S and the drain cell region D as long as the breakdown voltage of the LDMOSFET is maintained. When the size of the drain cell region D is equal to the sum of four (2×2) source cell regions S and spaces among them, high-concentration ions may be deeply implanted and diffused, to reduce the resistance of the high-concentration n$^+$ sinker region 7. For example, the distance between the source cell region S and the drain cell region D may be reduced to half of that of FIG. 3A. Namely, if an interval between adjacent source cell regions S is equal to the width of the source cell region S, the distance can be reduced to half of the width of the source cell region S.

Figure 4:
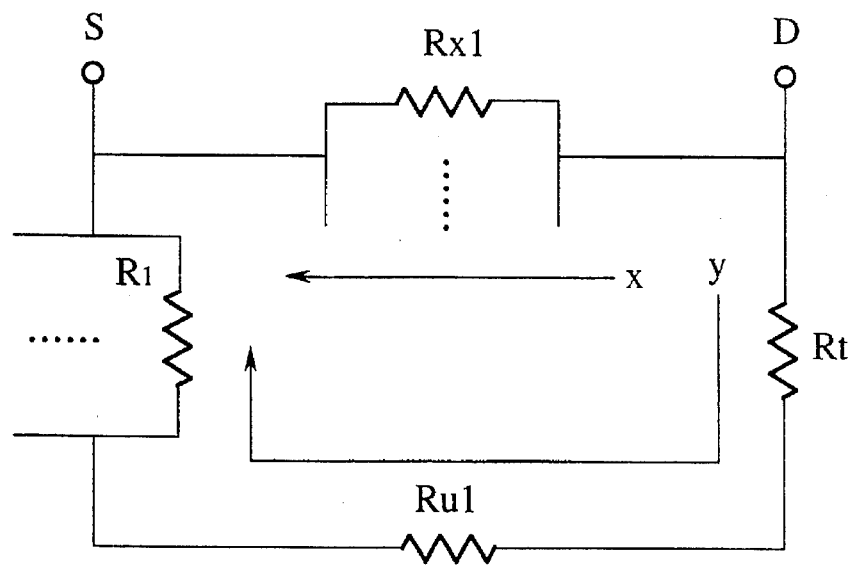
FIG. 4 is a circuit diagram showing an equivalent circuit to explain the ON resistance of the first embodiment.

FIG. 4 shows an equivalent circuit showing the ON resistance $R_{ON}$ of the LDMOSFET of the first embodiment. An arrow mark x indicates a current path for a source cell region S that faces a drain cell region D. Surface resistance $R_{x1}$ in the direction x is the sum of channel resistance $R_{ch}$ on the surface of the p base region 5 and spreading resistance from the channel to the n⁺ sinker region 7. An arrow mark y indicates a current path for a source cell region S that is distal from the drain cell region D. In this current path, resistance $R_1$ is the sum of the channel resistance $R_{ch}$ on the surface of the p base region 5, accumulation layer resistance $R_{ac}$, JFET resistance $R_{JFET}$, and resistance $R_D$ of the n drain region 4. The resistance $R_1$ is expressed as follows:

$$R_1 = R_{ch} + R_{ac} + R_{JFET} + R_D \quad (1)$$

$R_{u1}$ is the resistance of the n⁺ buried layer 2, and $R_r$ is the resistance of the n⁺ sinker region 7. In the following explanation, the resistance $R_1$ is called the drain channel resistance, and the channel resistance $R_{ch}$ on the surface of the p base region 5 is called the p base channel resistance $R_{ch}$.

Figure 5:
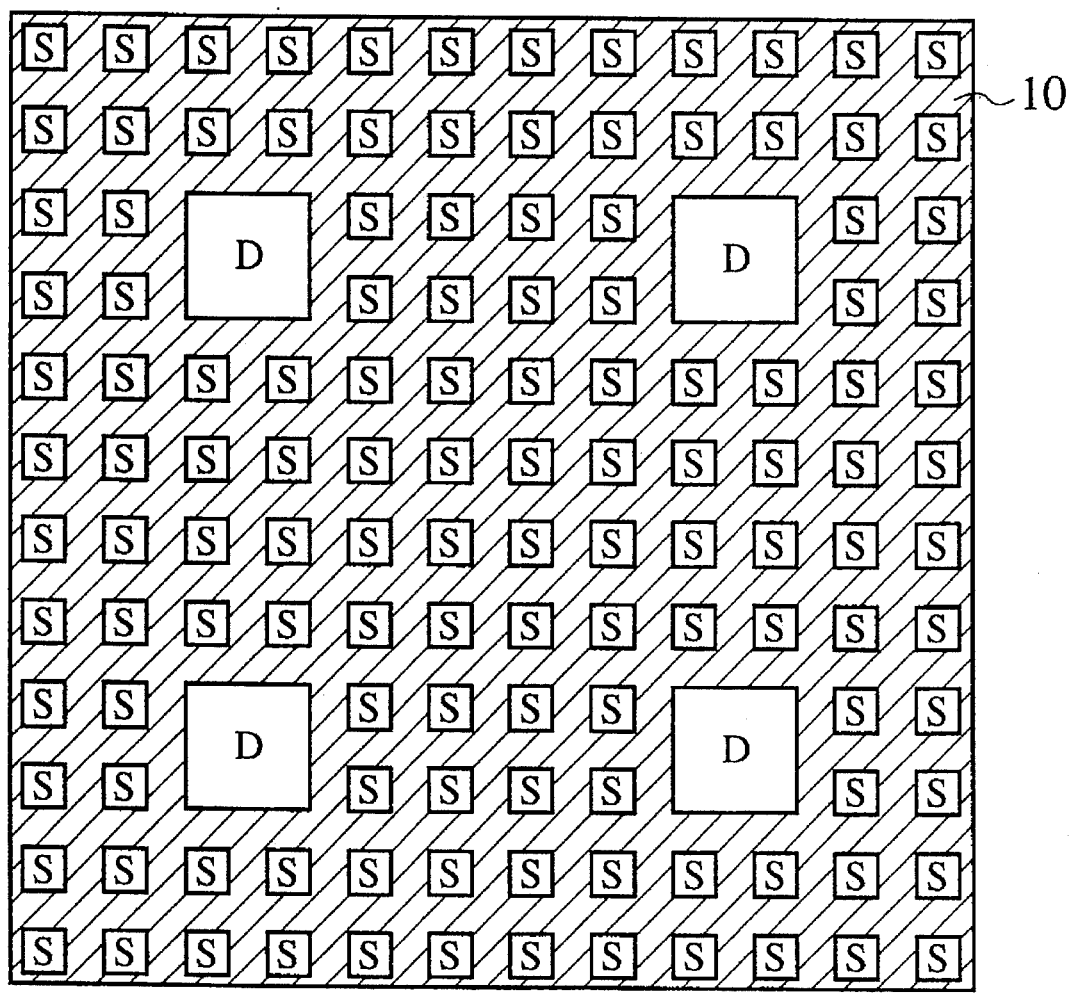
FIG. 5 is a plan view showing an arrangement of source and drain cell regions of an LDMOSFET according to a second embodiment of the present invention.

FIG. 5 is a plan view showing an arrangement of source cell regions S and drain cell regions D of an LDMOSFET according to the second embodiment of the present invention. A sectional view of this LDMOSFET resembles FIG. 2, and therefore, it is not shown again. The arrangement of source and drain cell regions of the second embodiment differs from that of the first embodiment. The second embodiment of FIG. 5 arranges six rows of source cell regions S in a basic square pattern. Central four (2×2) of the source cell regions S and spaces among them are replaced with a drain cell region D. Namely, the area of the drain cell region D is equal to the area of the four source cell regions S plus the area of spaces among the four source cell regions. The drain cell region D is surrounded by two rows of source cell regions S, and there are four rows of source cell regions S between adjacent drain cell regions D. The basic pattern of source and drain cell regions is cyclically arranged.

Figure 6:
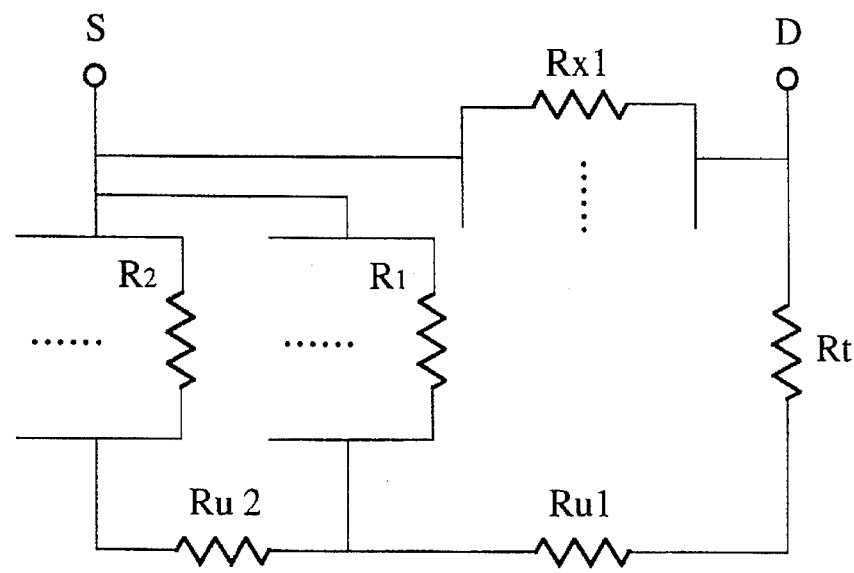
FIG. 6 is a circuit diagram showing an equivalent circuit to explain the ON resistance of the second embodiment.

FIG. 6 is an equivalent circuit showing the ON resistance $R_{ON}$ of the LDMOSFET of the second embodiment. A reference mark $R_2$ is the drain channel resistance of a current path of the second one of the source cell regions S that are not facing the drain cell region D. The drain channel resistance $R_2$ is the sum of p base channel resistance $R_{ch}$, accumulation layer resistance $R_{ac}$, JFET resistance $R_{JFET}$, and the resistance $R_D$ of the n drain region 4. $R_{u2}$ is the resistance of the n⁺ buried layer 2. The same parts as those of FIG. 4 are represented with like reference marks.

Figure 7:
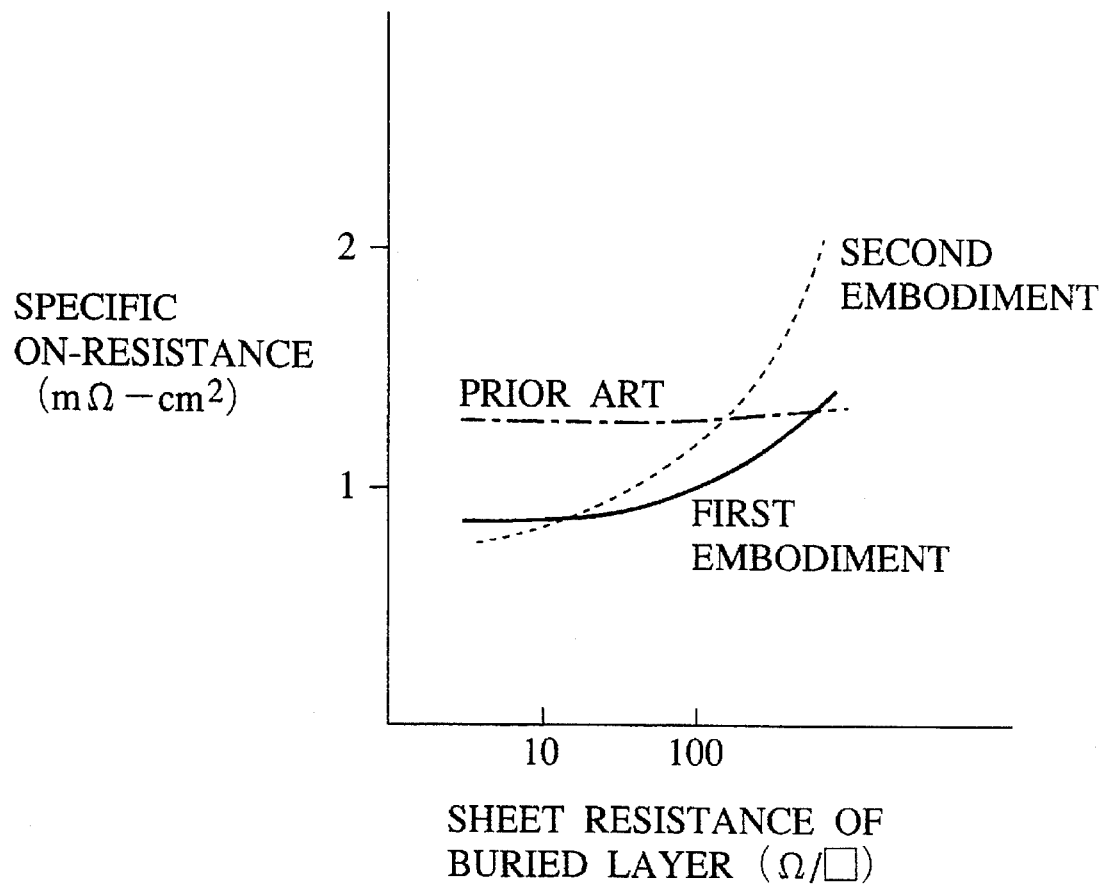
FIG. 7 shows a relationship between the sheet resistance of an $n_+$ buried layer 2 and the ON resistance $R_{ON}$·A of the LDMOSFET of the first embodiment, of the second embodiment, and of the prior art.

FIG. 7 shows a relationship between the sheet resistance of the n⁺ buried layer 2 and the ON resistance $R_{ON}$ of the LDMOSFET of the first embodiment, of the second embodiment, and of the prior art. In the figure, an ordinate represents the product $R_{ON}·A$ of the ON resistance $R_{ON}$ and an element area A. A continuous line indicates the first embodiment, a dotted line indicates the second embodiment, and a dot-dash line Indicates the prior art. Each of the LDMOSFETs has a breakdown voltage of 50 V, a gate oxide film of 50 nm thick, a threshold voltage of 1.7 V, a voltage of 12 V applied to a gate, an n drain region 4 of 0.4 Ωcm in specific resistance, an epitaxial layer 3 of 4 μm thick, source cell regions S arranged at pitches of 11 μm, and n⁺ sinker regions 7 of 5 Ω in resistance. As shown in FIG. 7, the present invention is capable of greatly reducing the ON resistance $R_{ON}·A$ compared to the prior art. This advantage owes to the low-resistance n⁺ sinker region 7 connected to the n⁺ buried layer 2, as well as the patterns shown in FIGS. 3A and 5 that improve the integration of channels and increase the number of parallel resistance paths between a drain and a source.

The arrangement according to the second embodiment achieves greater degree of integration of channels than the first embodiment, to further reduce the drain channel resistance values $R_1$ and $R_2$. The second embodiment, however, involves longer current paths in the buried layer 2 than the first embodiment, to increase the resistance $R_{u2}$ of the buried layer 2. Accordingly, if the sheet resistance of the buried layer 2 is high, the first embodiment is more effective in reducing the ON resistance of the LDMOSFET, as shown in FIG. 7. The first and second embodiments arrange two or four rows of source cell regions S between adjacent drain cell regions D. FIG. 7 indicates that increasing the number of rows of source cell regions S between adjacent drain cell regions D is effective to drop the drain channel resistance $(R_1, R_2, \ldots, R_n)$ as well as the ON resistance, if the resistance of the n⁺ buried layer 2 is low. Namely, if the resistance on the drain side (the resistance of the n⁺ buried layer 2 plus the resistance of the sinker region 7) is small, it is preferable to decrease the drain channel resistance $(R_1, R_2, \ldots R_n)$ and the ON resistance by increasing the ratio of the area of the source cell regions S to the area of the drain cell region D. On the other hand, if the sheet resistance of the buried layer 2 is greater than a specific value, the ON resistance will be undesirably increased if the number of rows of source cell regions S is increased to drop the drain channel resistance $(R_1, R_2, \ldots R_n)$ because increasing the number of rows of source cell regions S elongates the distance between each source cell region S and the sinker region 7, to thereby increase the resistance $(R_{u1}, R_{u2}, \ldots R_{un})$ of the n⁺ buried layer 2. Accordingly, if the sheet resistance of the buried layer 2 is greater than the specific value, the number of rows of source cell regions S must be reduced to shorten the distance from each source cell region S to the sinker region 7, to drop the ON resistance. In this way, the number of rows of source cell regions S between adjacent drain cell regions D is determined according to the sheet resistance of the n⁺ buried layer 2 and the resistance of the sinker region 7.

Figure 8:
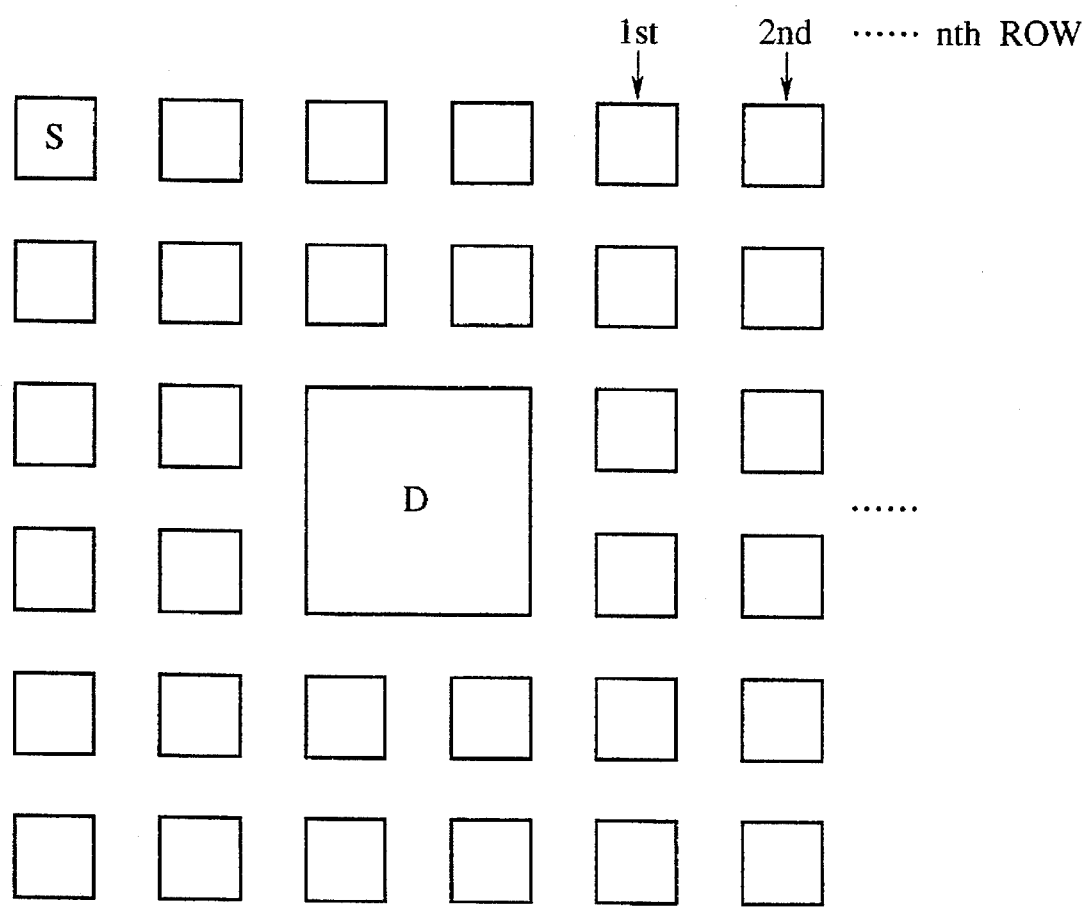
FIG. 8 is a plan view explaining rules for arranging source dell regions S between adjacent drain cell regions D.
Figure 9:
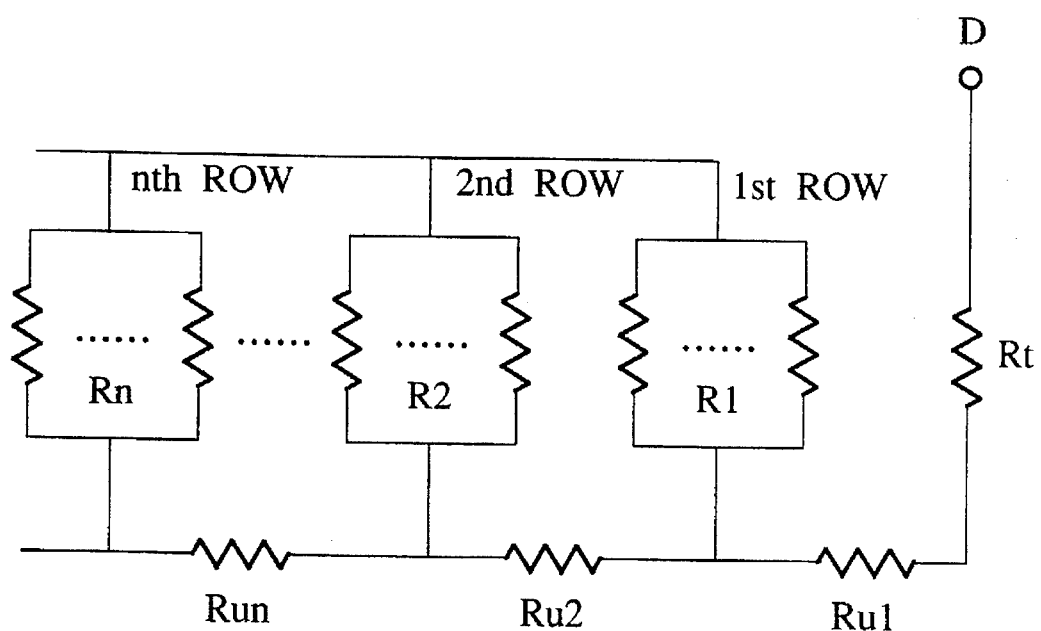
FIG. 9 is a circuit diagram showing an equivalent circuit of the arrangement of FIG. 8.

A rule for determining the number of rows of source cell regions S arranged between adjacent drain cell regions D will be explained with reference to FIG. 8. In the figure, the rows of source cell regions S are numbered from 1 to n starting from a drain cell region D. The length of an edge of the drain cell region D is equal to two edges of the source cell region S plus a space between adjacent source cell regions. Then, the number of source cell regions S in the "n"th row surrounding a drain cell region D is 12+8 (n−1). FIG. 9 shows an equivalent circuit of FIG. 8. In FIG. 9, $R_1$ to $R_n$ are the drain channel resistance values of the first to "n"th rows of source cell regions S, respectively, and $R_{u1}$ to $R_{un}$ are the resistance values of paths in the buried layer 2 related to the first to "n"th rows of source cell regions S, respectively.

For each source cell region S, the sum of the p base channel resistance $R_{ch}$, accumulation layer resistance $R_{ac}$, JFET resistance $R_{JFET}$, and the resistance $R_D$ of the n drain region 4, i.e., a drain channel resistance value is, for example, 471 Ω in the case of FIG. 7. A calculation method of the resistances is reported in, for example, "Optimum Design of Power MOSFETs" by Chenming Hu, et al., IEEE Transactions on Electron Devices, vol. ED-31, No. 12, pp. 1693 to 1700, December, 1984. Accordingly, the total drain channel resistance $R_n$ of source cell regions S in the "n"th row is expressed as follows:

$$R_n = 471/[12 + 8(n-1)] \quad (2)$$

On the other hand, the total resistance of the buried layer 2 from just under the "n"th row of source cell regions S up to just below the sinker region 7 is as follows:

$$\sum_{i=1}^{n} R_{ui} = R_{u1} + R_{u2} + \ldots + R_{un}$$

When the length of the sinker region 7 in contact with the n⁺ buried layer 2 is 13 μm, the sum is expressed as follows:

$$\sum_{i=1}^{n} R_{ui} = \frac{R_s}{8} \log \frac{33 + 22(n-1)}{13} \quad (3)$$

where $R_s$ is the sheet resistance of the buried layer 2. Table 1 shows results of calculations by the equations (2) and (3), in the range of 3<n<5 when the sheet resistance Rs of the buried layer 2 is 50 Ω.

TABLE 1

|  | $R_n$ | Comparison | $\Sigma R_{ui}$ |
| --- | --- | --- | --- |
| n = 3 | 16.8 | > | 11.1 |
| n = 4 | 13.1 | > | 12.7 |
| n = 5 | 10.7 | < | 13.9 |

When the sum $\Sigma R_{ui}$ of the equation (3) of the resistance of the buried layer 2 from just under the "n" th row of source cell regions S up to just under the sinker region 7 is greater than the total drain channel resistance $R_n$ of the equation (2) of the source cell regions in the "n" th row, there will be no advantage in increasing the area ratio of source cell regions to drain cell regions. Accordingly, in consideration of the range of changes of various factors such as the sheet resistance of the buried layer 2, n=5 will be an upper limit according to Table 1. Since there are "2n" rows of source cell regions S between adjacent drain cell regions D, an upper limit of the number of rows of source cell regions S between adjacent drain cell regions D is 10. Namely, the number of rows of source cell regions S between adjacent drain cell regions D must be in the range of 2 to 10. This result requires that the sheet resistance of the buried layer 2, etc., have the above-mentioned values. The above range is generally applicable to other LDMOSFETs of 50 to 100 V in breakdown voltage. Accordingly, the number of rows of source cell regions must be in the range of 2 to 10. The first and second embodiments of the present invention employ four or six rows of source cell regions S, to form a basic pattern of 4×4 or 6×6 source cell regions S in which 2×2 source cell regions S are replaced with a drain cell region D. It is possible to arrange five rows of source cell regions S in which 3×3 source cell regions are replaced with a drain cell region D. In this case, there are two rows of source cell regions S between adjacent drain cell regions D. In this way, the number of rows of source cell regions S and the size of a drain cell region D surrounded by the source cell regions S are properly determined according to the required size of the n⁺ sinker region 7.

A pattern for arranging source cell regions S is not limited to a square. For example, a regular triangle or hexagon pattern may be used. A combination of a regular octagon pattern and a square pattern is also acceptable.

The first and second embodiments of the present invention increase the number of source cell regions S with respect to a drain cell region D, to improve the degree of integration of channels including p base channels and drain channels. The present invention forms the first conductive region 2 of low resistance in the vicinity of an interface between the p substrate 1 and the bottom of the n drain region 4. The present invention employs the second conductive region 7 of low resistance to connect the first conductive region 2 to the first drain electrode 13, so that a current flows from the drain cell region D to distal source cell regions S through the low-resistance first and second conductive regions 2 and 7. The number of rows of source cell regions S arranged between adjacent drain cell regions D is in the range of two to ten, so that currents may flow from the drain cell region D to the source cell regions S through a current path that involves a channel and a current path that involves the low-resistance first conductive region 2. This arrangement increases the number of parallel resistance paths between a drain and a source, to thereby reduce the ON resistance $R_{ON}$.

Figure 10:
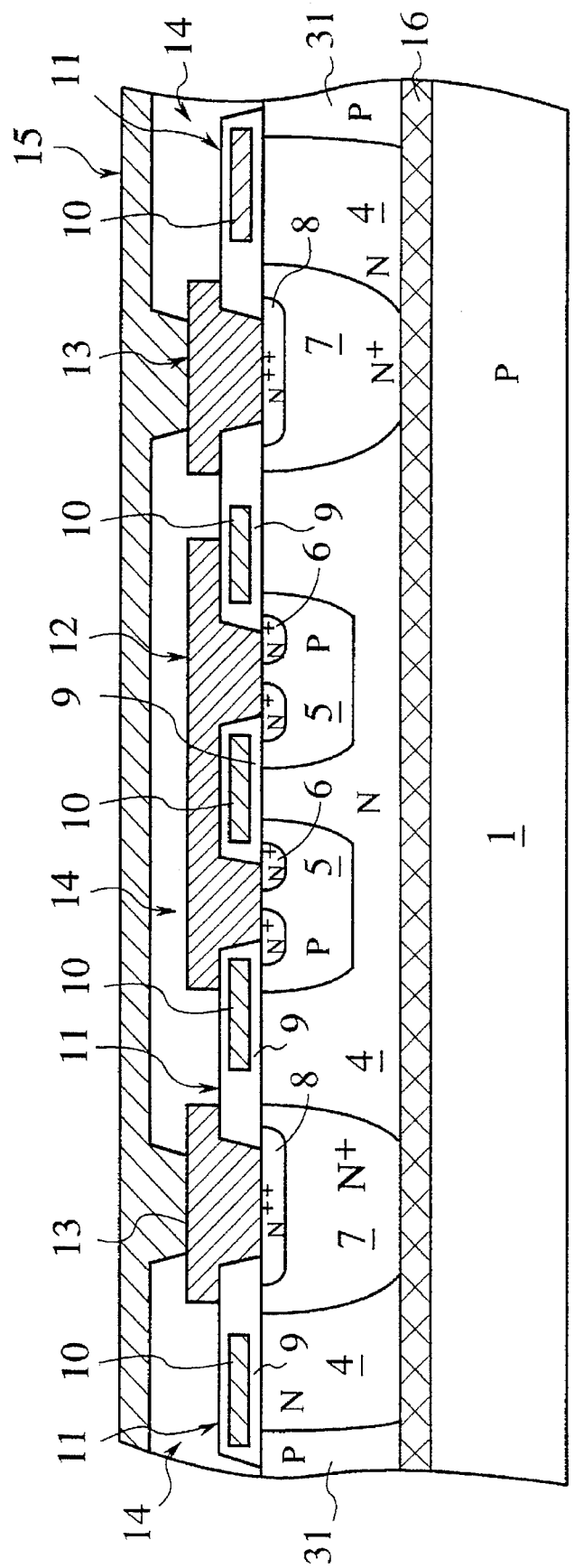
FIG. 10 is a sectional view showing an LDMOSFET according to a third embodiment of the present invention.

FIG. 10 is a sectional view showing an LDMOSFET according to the third embodiment of the present invention. The third embodiment employs, instead of the n⁺ buried layer 2, a low-resistance silicide layer 16 made of WSi₂, CoSi₂, TiSi₂, MoSi₂, or PtSi₂ on a principle plane of a p substrate 1. The resistance of the silicide layer 16 made of refractory metal silicide is lower than that of the n⁺ burled layer 2, to reduce the ON resistance of the LDMOSFET. The structure shown in FIG. 10 may be fabricated by SDB method. Namely, the low-resistance silicide layer 16 is formed on the p substrate 1, and the surface thereof is polished into a mirror surface. And, the surface of a second p substrate 31 is also polished into a mirror surface and is tightly attached to the mirror surface of the silicide layer 16. Then, they are heat-treated. This is called a silicon direct bonding (SDB) method. The surface of the second p substrate 31 is then polished to a required thickness.

Figure 11:
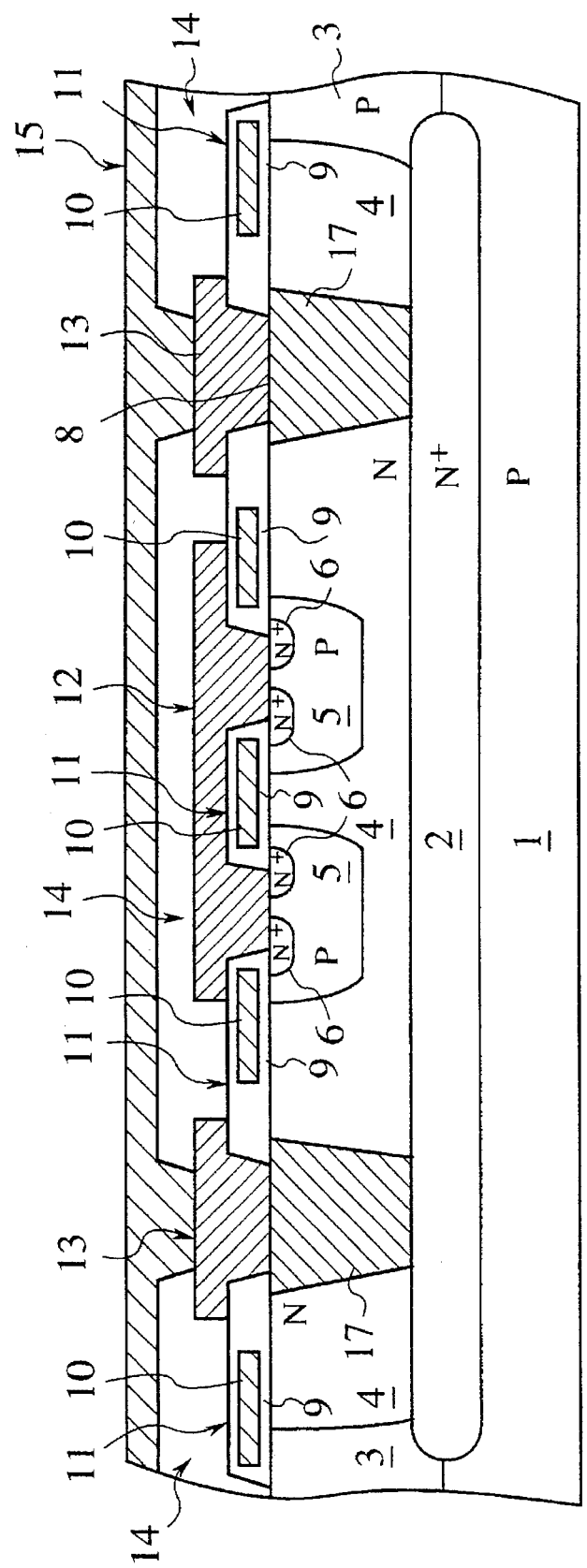
FIG. 11 is a sectional view showing an LDMOSFET according to a fourth embodiment of the present invention.

FIG. 11 shows an LDMOSFET according to the fourth embodiment of the present invention. The fourth embodiment forms a trench in an n drain region 4 up to an n⁺ buried layer 2. A low-resistance conductive film 17 is formed in the trench. The film 17 may be made of refractory metal such as W, Ti, and Mo, refractory metal silicide, aluminum, or doped silicon. The film 17 electrically connects a drain electrode 13 to the n⁺ buried layer 2. The film 17 may be deposited only along the inner wall of the trench, to form a pipe. This structure Is capable of reducing resistance more than the n⁺ sinker region 7 of FIG. 2 made by diffusion in semiconductor material, thereby reducing the ON resistance of the LDMOSFET. This embodiment employs the trench as a sinker region, to eliminate the deep diffusion process of forming the n⁺ sinker region 7. Namely, this embodiment never causes horizontal expansion of the n⁺ diffusion layer due to the deep diffusion. Accordingly, the fourth embodiment is capable of reducing the drain cell region D, to improve the degree of integration of elements and reducing the ON resistance. It is possible to combine the third and fourth embodiments. Namely, the n⁺ buried layer 2 of FIG. 11 may be replaced with the low-resistance silicide layer 16 of FIG. 10. The low-resistance conductive film 17 may be a composite film such as a polycide film.

In this way, the fourth embodiment is capable of reducing the resistance $R_t$ lower than that achieved by the sinker region 7 of the first to third embodiments that is formed by diffusing impurities into semiconductor material, to thereby reduce the ON resistance. Since the fourth embodiment forms a trench as the second conductive region, i.e., the sinker region 17, it requires no diffusion process, to thereby reduce the drain cell region D, improve the degree of integration of elements, and reduce ON resistance per unit chip area. If RIE or ECR ion etching method is employed to form the trench, the trench may have a large aspect ratio to improve area efficiency.

The first embodiment of FIG. 3A arranges four rows of source cell regions S at predetermined pitches in a square pattern and replaces central four (2×2) of the source cell regions S and spaces among them with a drain cell region D.

Figure 12:
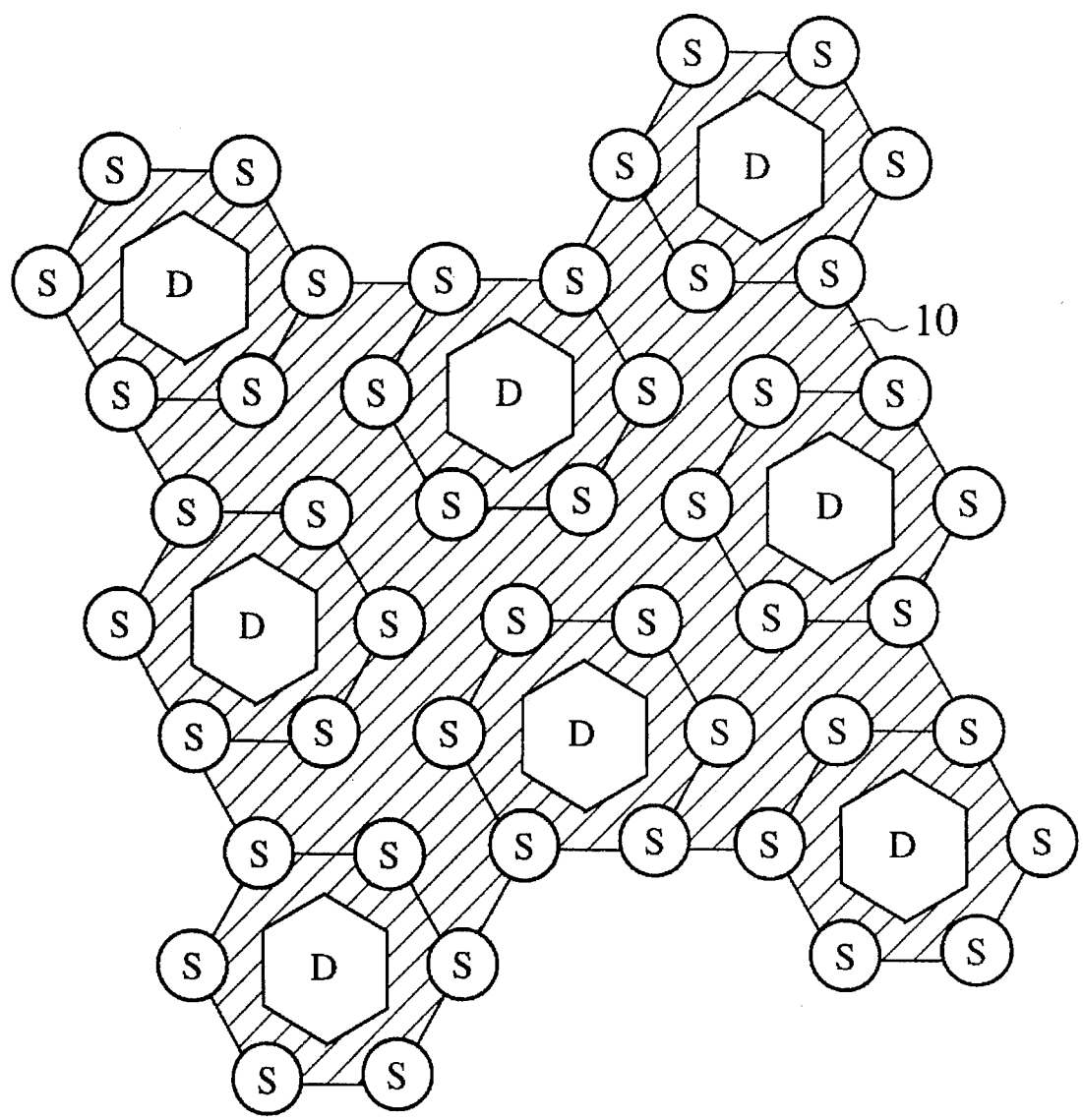
FIG. 12 is a ban view showing an arrangement of source and drain cell regions S and D according to a fifth embodiment of the present invention.

Namely, each drain cell region D is surrounded by a row of source cell regions S, and there are two rows of source cell regions S between adjacent drain cell regions D. This square pattern of source and drain cell regions S and D is a basic pattern, which is cyclically arranged. The second embodiment of FIG. 5 arranges six rows of source cell regions S at predetermined pitches in a square pattern and replaces central four (2×2) of the source cell regions S and spaces among them with a drain cell region D. Namely, each drain cell region D is surrounded by two rows of source cell regions S, and there are four rows of source cell regions S between adjacent drain cell regions D. It is possible to arrange five rows of source cell regions S in a square pattern at predetermined pitches and replace central nine (3×3) of the source cell regions S and spaces among them with a drain cell region D. It is possible to adopt other patterns of source and drain cell regions. The patterns of arranging source cell regions S are not necessarily square. FIG. 12 shows an LDMOSFET according to the fifth embodiment of the present invention having a regular hexagonal pattern of source and drain cell regions.

In FIG. 12. six circular source cell regions S are arranged at the vertexes of a regular hexagon, respectively, to form a hexagonal pattern. At the center of the hexagon, a smaller regular hexagonal drain cell region D is formed. This close-packed pattern secures a sufficient distance between the source cell regions S and the drain cell region D, to prevent the drain-source breakdown voltage of the LDMOSFET from dropping and sufficiently increase the area of the drain cell region D. The fifth embodiment employs the hexagonal drain cell region D, to increase the area of the drain cell region D by the corners thereof compared with a circular drain cell region, to thereby reduce the resistance $R_t$ of the sinker region 7. Each vertex of the drain cell region D is oriented to the center of a corresponding edge of the regular hexagon formed by the source cell regions S, to thereby increase the degree of integration. This arrangement reduces an effective distance between the n$^+$ source region 6 and the n$^+$ sinker region 7, to thereby reduce the surface resistance $R_{x1}$ in the direction x.

Figure 13:
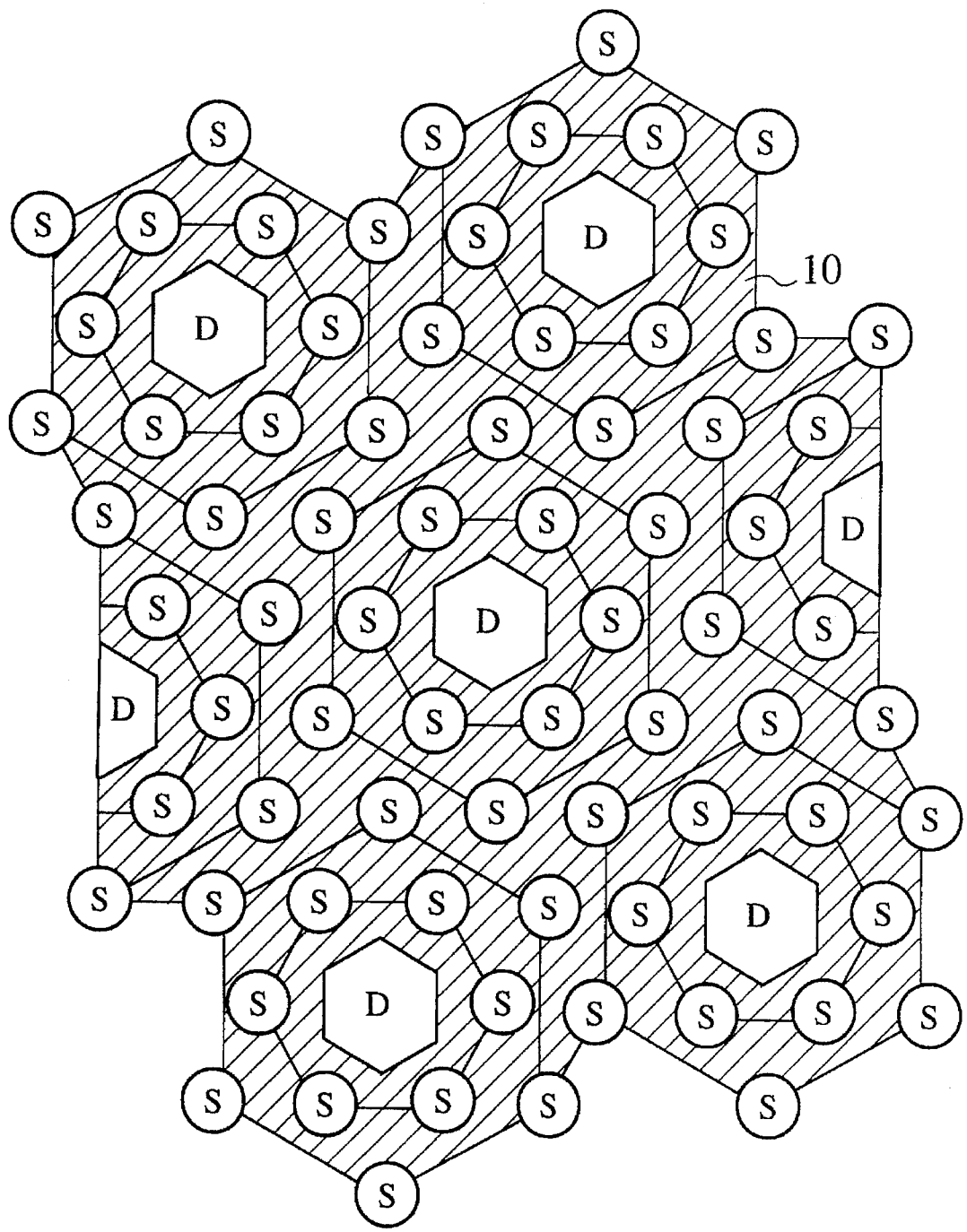
FIG. 13 is a plan view showing an arrangement of source and drain cell regions S and D according to a sixth embodiment of the present invention.

FIG. 13 is a plan view showing an arrangement of source and drain cell regions of an LDMOSFET according to the sixth embodiment of the present invention. This embodiment arranges six circular source cell regions S around a regular hexagonal drain cell region D, to form a first regular hexagonal pattern. In addition, a second regular hexagonal pattern consisting of six source cell regions S is arranged around the first regular hexagonal pattern. Namely, the sixth embodiment arranges 12 source cell regions S around a drain cell region D, to improve the degree of integration of source cell regions S. Accordingly, the ON resistance of the LDMOSFET can be further reduced If the sheet resistance of the n$^+$ buried layer 2 is low. The vertexes of the inner regular hexagon are oriented to the centers of the edges of the outer regular hexagon, respectively, to improve the degree of integration. Instead of the regular hexagons of this embodiment, regular octagons, regular dodecagons, etc., may be adopted.

Figure 14:
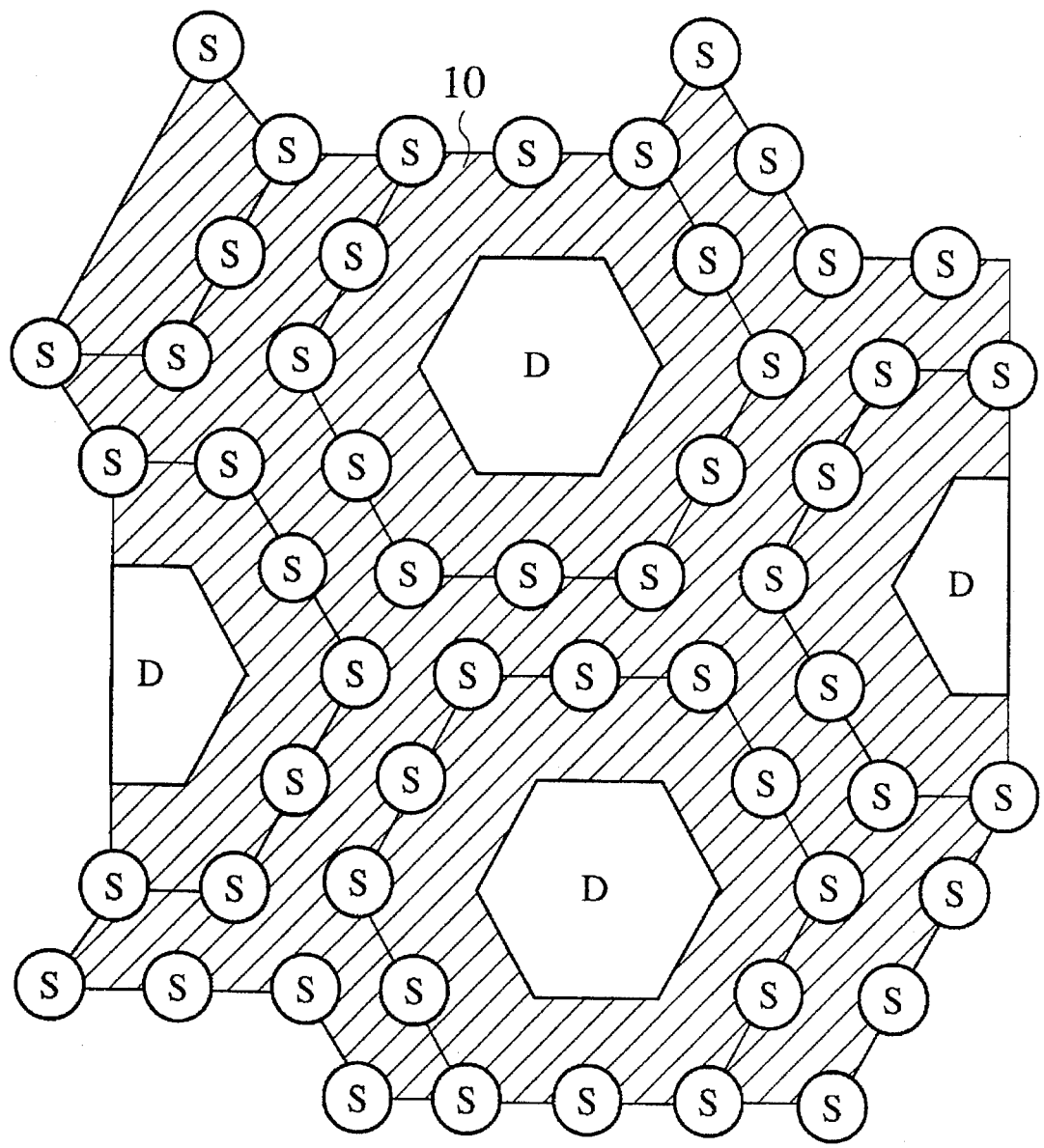
FIG. 14 is a plan view showing an arrangement of source and drain cell regions S and D according to a seventh embodiment of the present invention.

The fifth and sixth embodiments arrange source cell regions S at the vertexes of a regular polygon, respectively, and a smaller regular polygonal drain cell region D at the center of the regular polygon, to increase the area of the drain cell region D by the corners thereof compared with a circular drain cell region, to improve the degree of integration. When the vertexes of a regular polygonal drain cell region D are oriented to the centers of the edges of a regular polygonal pattern of source cell regions S as shown in FIG. 12, or when the vertexes of an inner regular polygonal pattern of source cell regions S are oriented toward the centers of the edges of an outer regular polygonal pattern of source cell regions S as shown in FIG. 13, the degree of integration is further improved. An optimum distance between a given source cell region S and another source cell region S is determined by opposing requirements of reducing JFET resistance and improving the degree of integration. Accordingly, the distance must not be too large. FIG. 14 shows an arrangement of source and drain cell regions according to the seventh embodiment of the present invention. This embodiment arranges source cell regions S at the vertexes and the centers of edges of a regular hexagon, respectively. This arrangement is capable of increasing the area of each drain cell region D without greatly increasing the distance between adjacent source cell regions S. In FIG. 14, the regular hexagonal drain cell region D is surrounded by 12 circular source cell regions S arranged in a regular hexagon pattern. In this way, the seventh embodiment arranges source cell regions S at the centers of the edges of a regular hexagon in addition to the vertexes thereof, to increase the area of the drain cell region D. This arrangement makes a deep high concentration n$^+$ sinker region 7 to be easily formed and reduces the resistance $R_t$ of the n$^+$ sinker region 7. In addition, this embodiment increases the degree of integration of source cell regions S and reduces drain channel resistance values $R_1$ and $R_2$, to thereby decrease the ON resistance $R_{ON}$·A.

Various modifications will become possible for those skilled in the art after receiving the teachings of the present disclosure without departing from the scope thereof. Although the embodiments arrange source cell regions in a square or regular hexagon pattern, it is possible to arrange the source cell regions in a regular octagon, regular dodecagon, any other regular hexagon, or circle pattern. Some patterns, however, deteriorate area efficiency. When the square pattern is employed, the shape of each source cell region S is preferably square as shown in FIGS. 3A and 5, to improve area efficiency. When the regular hexagonal pattern is employed, the shape of each source cell region S is preferably circular to equalize the distance between adjacent source cell regions S, as shown in FIG. 12 to 14. Instead, the shape of each source cell region S may be regular hexagonal to provide the same effect.

In any case, the present invention easily fabricates an LDMOSFET of 50 to 100 V in breakdown voltage having low ON resistance and integrates the LDMOSFETs into an intelligent power IC.

What is claimed is:

1. A power LDMOSFET having a multiplicity of unitcells, each of said unitcells comprising:

a semiconductor substrate of a first conductivity type, a first conductive region formed on the semiconductor substrate, a drain region of a second conductivity type formed on the first conductive region, a gate insulation film formed on the surface of the drain region, a gate electrode formed on the gate insulation film, a drain opening formed through the gate electrode, a source opening array arranged in a form of a concentric polygonal ring surrounding the drain opening, the concentric polygonal ring including at least two polygonal rings having a plurality of source openings arranged on the at least two polygonal rings, the source openings formed through the gate electrode, and each ring of the at least two polygonal rings being arranged to have a predetermined spacing therebetween, a base region of the first conductivity type formed under each of the source openings, a source region of the second conductivity type formed in each of the base regions, a plurality of source electrodes formed on and in contact with the source regions, a drain contact region formed under the drain opening, a second conductive region of low resistance to electrically connect the first conductive region to the drain contact region, a first drain electrode formed on and in contact with the drain contact region, and an insulation interlayer formed on the source regions, and a second drain electrode formed on the insulation interlayer and electrically connected to the first drain electrode.

2. The power LDMOSFET as recited in claim 1, wherein the first conductive region is a semiconductor buried layer of the second conductivity type.

3. The power LDMOSFET as recited in claim 1, wherein the first conductive region is a refractory metal silicide layer.

4. The power LDMOSFET as recited in claim 1, wherein the second conductive region is a diffusion region of impurities of the second conductivity type.

5. The power LDMOSFET as recited in claim 1, wherein the second conductive region is made of a trench extending from the surface of the drain region up to the first conductive region and low-resistance material disposed inside the trench.

6. The power LDMOSFET as recited in claim 1, wherein the source opening array is arranged in a square form so that the source openings are arranged in a X-Y matrix form, and the drain opening is formed in an area corresponding to two rows by two columns of the source openings.

7. The power LDMOSFET as recited in claim 1, wherein the source opening array is formed as an n (n is equal to 3 or larger) polygon pattern, and the source openings are arranged at the vertexes of a regular n-angle polygon pattern, respectively, and a regular n-angle polygon drain opening is arranged inside the source opening array.

8. The power LDMOSFET as recited in claim 1, wherein 2n source openings are arranged for the source opening array at the vertexes and the centers of edges of a regular n-angle polygon pattern, respectively, and a regular n-angle polygon drain opening is arranged inside the source opening array.

9. A power LDMOSFET comprising:

a semiconductor substrate of a first conductivity type, a first conductive region formed on the semiconductor substrate, a drain region of a second conductivity type formed on the first conductive region, a gate insulation film formed on a surface of the drain region, a gate electrode formed on the gate insulation film, at least two drain openings formed through the gate electrode, a source opening array arranged in a form of a polygonal ring surrounding each of the drain openings, the source opening array comprising a plurality of source openings formed through the gate electrode, the source openings arranged on the polygonal ring, a base region of the first conductivity type formed under each of the source openings, a source region of the second conductivity type formed in each of the base regions, a plurality of source electrodes formed on and in contact with the source regions, a drain contact region formed under each of the drain openings, a second conductive region of low resistance to electrically connect the first conductive region to each of the drain contact regions, a first drain electrode formed on and in contact with each of the drain contact regions, an insulation interlayer formed on the source regions, and a second drain electrode formed on the insulation interlayer and electrically connected to the first drain electrode, wherein the respective polygonal rings are arranged to have a predetermined spacing therebetween, and the predetermined spacing is selected such that depletion layers expanding from the base regions do not increase a resistance in the drain region.

10. The power LDMOSFET as recited in claim 9, wherein the first conductive region is a semiconductor buried layer of the second conductivity type.

11. The power LDMOSFET as recited in claim 9, wherein the first conductive region is a refractory metal silicide layer.

12. The power LDMOSFET as recited in claim 9, wherein the second conductive region is a diffusion region of impurities of the second conductivity type.

13. The power LDMOSFET as recited in claim 9, wherein the second conductive region has a trench extending from the surface of the drain region to the first conductive region, and wherein low-resistance material is disposed inside the trench.

14. The power LDMOSFET as recited in claim 9, wherein the source opening array is arranged in a square form so that the source openings are arranged in a X-Y matrix form, and the drain opening is formed in an area corresponding to two rows by two columns of the X-Y matrix.

15. The power LDMOSFET as recited in claim 9, wherein each of the polygonal rings is a regular n-angle polygon pattern, n being an integer greater than or equal to 3, and source openings are arranged at the vertexes of the regular n-angle polygon pattern, respectively, and a rectangular n-angle polygon drain opening is arranged inside the regular n-angle polygon pattern.

16. The power LDMOSFET as recited in claim 9, wherein each of the polygonal rings is a regular n-angle polygon pattern, n being an integer greater than or equal to 3, and 2 n source openings are arranged at the vertexes and the centers of edges of the regular n-angle polygon pattern, respectively, and a regular n-angle polygon drain opening is arranged inside the regular n-angle polygon pattern.

* * * * *